(12) United States Patent
Yamamura

(10) Patent No.: US 7,460,390 B2
(45) Date of Patent: Dec. 2, 2008

(54) FERROELECTRIC MEMORY DEVICE

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 119 days.

(21) Appl. No.: 11/616,407

(22) Filed: Dec. 27, 2006

(65) Prior Publication Data

US 2007/0147103 A1    Jun. 28, 2007

(30) Foreign Application Priority Data

Dec. 28, 2005    (JP)    ............................. 2005-377708

(51) Int. Cl.
*G11C 11/22*    (2006.01)
(52) U.S. Cl. .................................... 365/145; 365/210.1
(58) Field of Classification Search ................. 365/145, 365/210.1, 203
See application file for complete search history.

(56) References Cited

U.S. PATENT DOCUMENTS 6,426,906 B1 *    7/2002    Igarashi ....................... 365/204
6,487,103 B2 *    11/2002    Yamamoto et al. .......... 365/145
7,154,768 B2 *    12/2006    Chen et al. ................... 365/145

FOREIGN PATENT DOCUMENTS

JP    2002-157876    5/2002

* cited by examiner

*Primary Examiner*—Anh Phung
(74) *Attorney, Agent, or Firm*—Harness, Dickey & Pierce, P.L.C.

(57) ABSTRACT

When reading first memory cell data in a ferroelectric memory device, voltage on first bit lines changes. Therefore, controllers turn on first transistors in first read-out voltage generators based on the first bit line voltage, and control the first transistors' channel resistance. When the first transistors turn on, the pre-charged drain voltage lowers and the first read-out voltage generators output the lowered voltage as the first memory cell data's voltage. When reading second memory cell data, a second read-out voltage generator outputs a second transistor's drain voltage that is lowered based on the data as the second memory cell data's voltage. When the second read-out voltage generator outputs the read-out voltage, a reference voltage generator generates a reference voltage equal to the read-out voltage. Because the reference voltage generator has a higher voltage supply capacity than the second read-out voltage generator, the reference voltage is supplied to sense amplifiers.

10 Claims, 5 Drawing Sheets

FERROELECTRIC MEMORY DEVICE

The entire disclosure of Japanese Patent Application No. 2005-377708, filed Dec. 28, 2005 is expressly incorporated by reference herein.

BACKGROUND

1. Technical Field

The present invention relates to ferroelectric memory devices.

2. Related Art

Japanese laid-open patent application JP-A-2002-157876 (patent document 1) describes a typical ferroelectric memory. In the ferroelectric memory described in the above document, bit lines connected to a 2T2C cell for one bit for generating reference voltages are connected to a sense amplifier through a level shift circuit having P-channel source followers composed of PMOS transistors, and the sense amplifier takes voltages that have passed through the level shift circuit as reference voltages (see the third embodiment described in the patent document 1).

However, the ferroelectric memory described above uses the voltages that have passed through the level shift circuits as reference voltages, and thus has a problem in which its read-out margin is relatively small. Also, in the ferroelectric memory described above, the level shift circuit needs to be connected not only to a bit line to which the cell for generating reference voltages is connected, but to another bit line that does not essentially require the level shift circuit. This causes a problem of an increased layout area.

SUMMARY

In accordance with an advantage of some aspects of the present invention, it is possible to provide ferroelectric memory devices that can solve the problems described above. It is noted that the advantage can be achieved by a combination of features recited in independent claims in the claimed invention, and advantageous concrete examples of the invention are further defined in dependent claims.

In accordance with an embodiment of the invention, a ferroelectric memory device is equipped with: a plurality of first bit lines; a plurality of first memory cells that are connected to each of the first bit lines and store first data or second data; a plurality of first read-out voltage generation sections, each of which is connected to each of the plurality of first bit lines, and upon reading data from the plurality of first memory cells, generates a read-out voltage based on the data; a second bit line; a second memory cell that is connected to the second bit line and stores the first data; a second read-out voltage generation section that is connected to the second bit line, and upon reading data from the second memory cell, generates a read-out voltage based on the data; a first reference voltage generation section connected to the second read-out voltage generation section; and a plurality of first sense amplifiers connected to each of the read-out voltage generation sections and the first reference voltage generation section, wherein each of the read-out voltage generation sections includes a first n-type MOS transistor having a source to which a first voltage is supplied, a first precharge section that pre-charges a drain of the first n-type MOS transistor with a second voltage that is a positive voltage higher than the first voltage, a transistor control section that, when data stored in any of the memory cells is read out onto each of the bit lines, controls a channel resistance between the source and the drain of the first n-type MOS transistor based on a voltage on the bit line to lower the voltage on the drain pre-charged to the second voltage, thereby generating the read-out voltage, and a voltage control section that lowers the voltage on the bit line based on the lowering of the voltage on the drain; the first reference voltage generation section has a voltage supply capacity greater than the second read-out voltage generation section, and receives a read-out voltage generated by the second read-out voltage generation section and generates a first reference voltage that is generally the same voltage as the read-out voltage; and the plurality of first sense amplifiers compare the read-out voltage generated by the corresponding first read-out voltage generation sections with the first reference voltage, respectively, to thereby judge data stored in the first memory cells.

In accordance with the embodiment described above, when data is read out from each of the plurality of first memory cells, the voltage on each of the corresponding plurality of first bit lines changes based on the data. Each of the corresponding transistor control sections turns on the first n-type MOS transistor provided in each of the corresponding first read-out voltage generation sections based on the voltage on the first bit line, and further controls the on-resistance (channel resistance) of the first n-type MOS transistor. When the first n-type MOS transistor is turned on, the drain voltage pre-charged to the second voltage lowers, and the first read-out voltage generation section outputs the lowered drain voltage as a read-out voltage of the data stored in the first memory cell.

On the other hand, when data is read out from the second memory cell, the second read-out voltage generation section similarly outputs a drain voltage of the second n-type MOS transistor lowered based on the data as a read-out voltage of the data stored in the second memory cell. When the read-out voltage is outputted from the second read-out voltage generation section, the first reference voltage generation section generates a first reference voltage that is generally the same voltage as the read-out voltage. Because the first reference voltage generation section has a higher voltage supply capacity than the second read-out voltage generation section, the first reference voltage is supplied to the plurality of first sense amplifiers with hardly any change in its voltage value, even though the voltage supply capacity of the second read-out voltage generation section is low.

According to the embodiment described above, the first reference voltage generation section is equipped with a higher voltage supply capacity, such that a voltage value of the read-out voltage outputted from the second read-out voltage generation section having a lower voltage supply capacity can be supplied to the plurality of first sense amplifiers with hardly any change in the voltage value, whereby the ferroelectric memory device with stable read-out operation can be provided. Also, in accordance with the embodiment described above, the first reference voltage generation section having a higher voltage supply capacity only needs to be provided for the second read-out voltage generation section, such that an increase in the chip area of the ferroelectric memory device can be suppressed.

Also, in accordance with the embodiment described above, the on-resistance of the first n-type MOS transistor greatly changes by even a minute change in the voltage on the bit line. Accordingly, by the embodiment described above, a lowered voltage amount in the drain voltage of the first n-type MOS transistor can be made into a great change based on data stored in the memory cell, whereby the ferroelectric memory device with a small circuit scale and a small chip area, and with a large read-out margin can be provided.

Also, in accordance with the embodiment described above, the voltage control section suppresses an increase in the voltage on the bit line, such that the voltage impressed to the memory cell can be made higher. Accordingly, in accordance with the embodiment described above, the read-out margin can be made even greater.

The ferroelectric memory device in accordance with an aspect of the embodiment of the invention may be further equipped with: a third bit line; a third memory cell that is connected to the third bit line and stores second data; a third read-out voltage generation section that is connected to the third bit line, and generates a read-out voltage based on data read out from the third memory cell; a second reference voltage generation section that has a voltage supply capacity greater than the third read-out voltage generation section, and generates a second reference voltage that is generally the same voltage as the read-out voltage generated by the third read-out voltage generation section; and a plurality of second sense amplifiers that are connected to each of the first read-out voltage generation sections, and compares the read-out voltage generated by each of the first read-out voltage generation sections with the second reference voltage, wherein the first sense amplifier and the second sense amplifier connected to each of the corresponding first bit lines may judge the data read out from each of the corresponding first memory cells based on a comparison result of the first sense amplifier and a comparison result of the second sense amplifier.

The ferroelectric memory device in accordance with an aspect of the embodiment of the invention may be further equipped with a first wiring that is connected to the second read-out voltage generation section and the first reference voltage generation section, and supplies a read-out voltage generated by the second read-out voltage generation section to the first reference voltage generation section, a second wiring that is connected to the third read-out voltage generation section and the second reference voltage generation section, and supplies a read-out voltage generated by the third read-out voltage generation section to the second reference voltage generation section, and a capacitance element provided between the first wiring and the second wiring.

In the ferroelectric memory device in accordance with an aspect of the embodiment of the invention, the first reference voltage generation section may be a first operation amplifier being negatively fed back, receive a read-out voltage generated by the second read-out voltage generation section as an input, and output the first reference voltage, and the second reference voltage generation section may be a second operation amplifier being negatively fed back, receive a read-out voltage generated by the second read-out voltage generation section, and output the second reference voltage.

The ferroelectric memory device in accordance with an aspect of the embodiment of the invention may preferably be further equipped with a first reference voltage line that is connected to an output of the first operation amplifier and the plurality of first sense amplifiers, a second reference voltage line that is connected to an output of the second operation amplifier and the plurality of second sense amplifiers, and a second precharge section that pre-charges the first reference voltage line and the second reference voltage line to a first voltage, wherein the first reference voltage generation section and the second reference voltage generation section may supply the first reference voltage and the second reference voltage to the first reference voltage line and the second reference voltage line pre-charged to the first voltage.

In the ferroelectric memory device in accordance with an aspect of the embodiment of the invention, the transistor control section may include a third precharge section that pre-charges the gate of the first n-type MOS transistor to a specified positive voltage, and a first capacitor provided between the bit line and the gate.

In the ferroelectric memory device in accordance with an aspect of the embodiment of the invention, the second pre-charge section may pre-charge the gate to a threshold voltage of the first n-type MOS transistor.

In the ferroelectric memory device in accordance with an aspect of the embodiment of the invention, the voltage control section may include a second capacitor provided between the drain of the first n-type MOS transistor and the bit line.

In the ferroelectric memory device in accordance with an aspect of the embodiment of the invention, the first voltage may be a ground voltage.

DESCRIPTION OF EXEMPLARY EMBODIMENTS

Preferred embodiments of the invention are described below with reference to the accompanying drawings. However, the embodiments described below do not limit the invention recited in the scope of claimed invention, and all combinations of the features described in the embodiments may not necessarily be essential to the means for solutions achieved by the invention.

Figure 1:
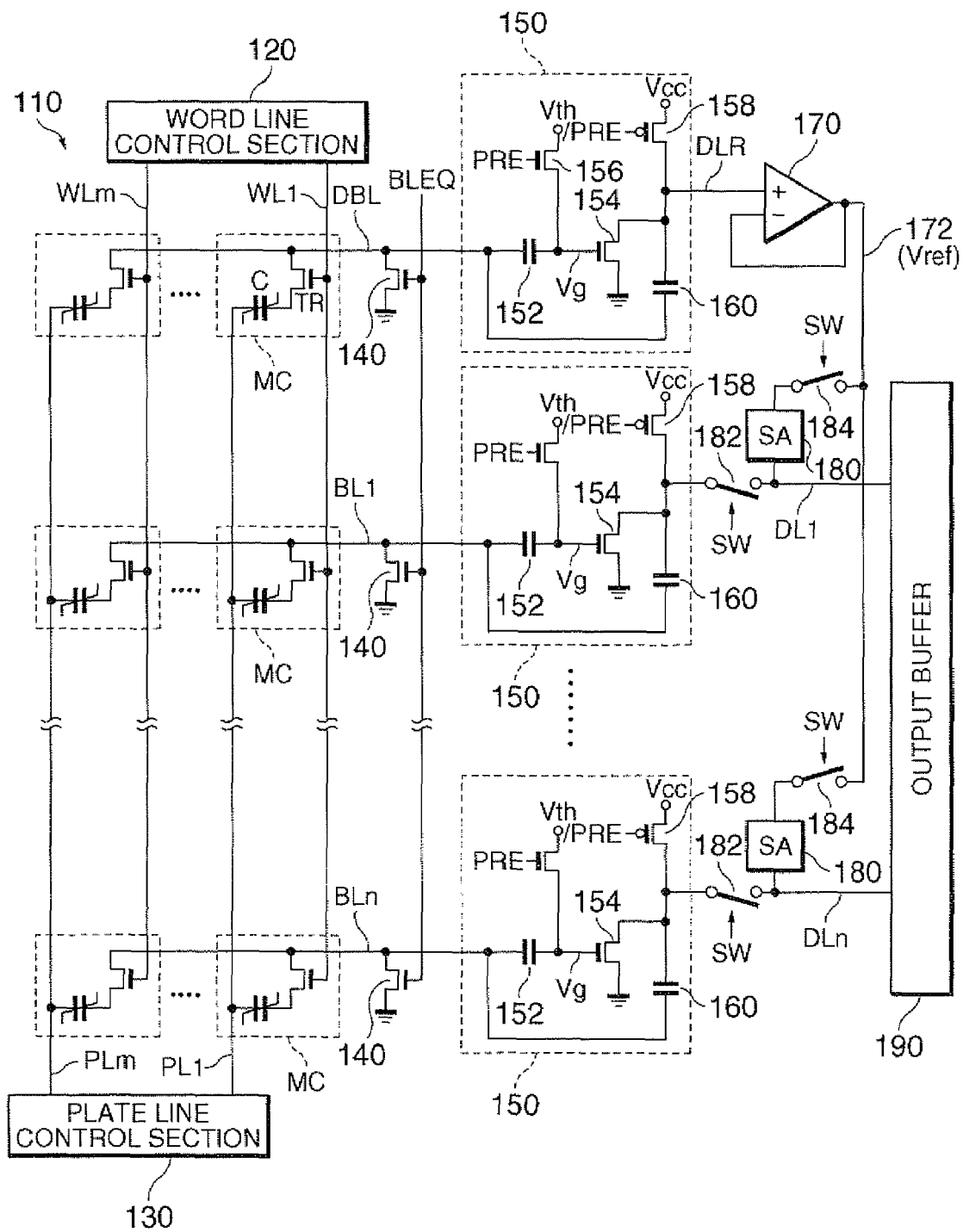
FIG. 1 is a diagram showing a ferroelectric memory device in accordance with a first embodiment of the invention.

FIG. 1 is a diagram showing a ferroelectric memory device in accordance with a first embodiment of the invention. The ferroelectric memory device is equipped with a memory cell array 110, a word line control section 120, a plate line control section 130, n-type MOS transistors 140, read-out voltage generation sections 150, an operation amplifier 170, sense amplifiers 180, and an output buffer 190.

The ferroelectric memory device is also equipped with m (m is a positive integer) word lines WL1-$m$ and m plate lines PL1-$m$, n (n is a positive integer) bit lines BL1-$n$ which are one example of a plurality of first bit lines, a dummy bit line DBL which is one example of a second bit line, n data lines DL1-$n$, a dummy data line DLR, n switches 182, and n switches 184.

The memory cell array 110 includes (m×n) memory cells MC arranged in an array configuration. Each of the memory cells MC has an n-type MOS transistor TR and a ferroelectric capacitor C.

The n-type MOS transistor TR has a gate that is connected to one of the word lines WL1-$m$, a source that is connected to one of the dummy bit line DBL and bit lines BL1-$n$, and a drain that is connected to one end of the ferroelectric capacitor C. In other words, the n-type MOS transistors TR switch, based on the voltage on the corresponding word lines WL1-*m*, as to whether or not the one ends of the ferroelectric capacitors C are connected to the corresponding dummy bit line DBL and bit lines BL1-*n*, respectively.

The other end of the ferroelectric capacitor C is connected to one of the plate lines PL1-*m*, stores predetermined data based on a potential difference between the one end and the other end thereof, and discharges a predetermined charge to the corresponding one of the dummy bit line DBL and bit lines BL1-*n* based on the stored data. In accordance with the present embodiment, the ferroelectric capacitor C stores data "1" when a potential on the other end with respect to a potential on the one end becomes higher than its coercive voltage, and stores data "0" when a potential on the one end with respect to a potential on the other end becomes higher than its coercive voltage.

The word line control section 120 is connected to the word lines WL1-*m*, and controls the voltage on the word lines WL1-*m*. More concretely, the word line control section 120 sets the potential on specified word lines WL among the word lines WL1-*m*, based on an address signal supplied from outside of the ferroelectric memory device, higher than the potential on the other word lines, to thereby select n number of the memory cells MC which are connected to the selected word lines WL.

The plate line control section 130 is connected to the plate lines PL1-*n*, and controls the voltage on the plate lines PL1-*m*. More concretely, the plate line control section 130 sets the potential on specified plate lines PL among the plate lines PL1-*m*, based on an address signal, higher than the potential on the other plate lines, to thereby select the specified plate lines PL.

The n-type MOS transistor 140 has a source grounded, and a drain connected to one of the corresponding dummy bit line DBL and bit lines BL1-*n*. Also, the n-type MOS transistor 140 has a gate to which a signal BLEQ is supplied, and switches, based on the voltage of the signal BLEQ, as to whether or not the corresponding one of the dummy bit line DBL and bit lines BL1-*n* is grounded.

The read-out voltage generation section 150 is equipped with a capacitor 152, which is an example of the first capacitor, n-type MOS transistors 154 and 156, a p-type MOS transistor 158, and a capacitor 160, which is an example of the second capacitor. The read-out voltage generation section 150 is provided for each of the dummy bit line DBL and bit lines BL1-*n*, amplifies the voltage on the corresponding one of the dummy bit line DBL and bit lines BL1-*n* when data is read from the memory cell MC, and outputs the amplified voltage.

The capacitor 152 has one end connected to one of the dummy bit line DBL and bit lines BL1-*n*, and the other end connected to the gate of the n-type MOS transistor 154. The capacitor 152 changes the gate voltage of the n-type MOS transistor 154 based on a change in the voltage on the corresponding one of the dummy bit line DBL and bit lines BL1-*n*.

The n-type MOS transistor 154 has a source grounded, and a drain connected to an output of the read-out voltage generation section 150. Further, the n-type MOS transistor 154 turns on and off based on its gate voltage. Moreover, the n-type MOS transistor 154, when it is turned on, controls the channel resistance between the source and the drain based on the gate voltage, and outputs the drain voltage to the corresponding one of the data lines DL1-*n* through the switch 182, and directly to the dummy data line DLR, as a read-out voltage based on the data read out onto the corresponding one of the bit lines BL1-*n* and dummy bit line DBL.

The n-type MOS transistor 156 has a source connected to the gate of the n-type MOS transistor 154, and a drain being supplied with a voltage Vth that is about the threshold voltage of the n-type MOS transistor 154. Further, the n-type MOS transistor 156 charges the gate of the n-type MOS transistor to about its threshold voltage based on the voltage of a signal PRE supplied at its gate.

The p-type MOS transistor 158 has a source supplied with an operation voltage VCC of the ferroelectric memory, which is an example of the second voltage, and a drain that is connected to the drain of the n-type MOS transistor 154. Then, p-type MOS transistor 158 charges the drain of the n-type MOS transistor 154 to VCC based on a signal /PRE (an inversion signal of the signal PRE) supplied at its gate. In accordance with the present embodiment, the p-type MOS transistor 158 pre-charges the drain voltage of the n-type MOS transistor 154 to VCC, and the drain voltage is lowered to a voltage between VCC and 0V by the n-type MOS transistor 154. Accordingly, the voltage that is used in the read-out voltage generation section 150 can be set to the range between the ground voltage and VCC which are used in the ferroelectric memory device, whereby it is possible to provide a structure whose voltage control is easy and which does not require level shift circuits.

The capacitor 160 has one end connected to the drain of the n type MOS transistor 154, and the other end connected to one of the corresponding dummy bit line DBL and bit lines BL1-*n*. The capacitor 160 changes the voltage on the corresponding one of the dummy bit line DBL and bit lines BL1-*n* based on a change in the drain voltage of the n-type MOS transistor 154.

The operation amplifier 170 has a positive input terminal, a negative input terminal and an output terminal, with the positive input terminal being connected to the dummy data line DLR, and the negative input terminal connected to the output terminal. In other words, the operation amplifier 170 is negatively fed back, and supplies a voltage that is generally the same as the read-out voltage supplied to its positive input terminal to a wiring 172 connected to its output terminal as a reference voltage Vref. Also, the operation amplifier 170 is structured to have a voltage supply capacity higher than that of the read-out voltage generation section 150. In accordance with the present embodiment, the reference voltage Vref is set to a voltage between a read-out voltage when the data stored in the memory cell MC connected to the bit lines BL-n is "0" and a read-out voltage when the data is "1."

The sense amplifier 180 has one end and the other end, in which the one end is connected to one of the corresponding data lines DL1-*n*, and also connected to the output of the read-out voltage generation section 150 through the switch 182. Also, the other end of the sense amplifier 180 is connected to the wiring 172 through the switch 184. The switches 182 and 184 are, for example, MOS transistors, transfer gates or the like, and turn on and off, according to the logical value of a signal SW, to switch as to whether or not the sense amplifier 180 is connected to the corresponding one of the data lines DL1-*n* and the wiring 172. The signal SW may be a signal that is synchronized with a signal for controlling as to whether or not the sense amplifier 180 is operated.

In other words, while the switches 182 and 184 are on, the sense amplifier 180 is supplied at its one end with a read-out voltage based on data read out on the corresponding one of the bit lines BL1-*n*, and is supplied at the other end with a reference voltage Vref. While the switches 182 and 184 are off, the sense amplifier 180 compares the read-out voltage with the reference voltage Vref, and supplies a result of the comparison to the output buffer 190. More concretely, when the read-out voltage is higher than the reference voltage Vref, the sense amplifier 180 sets the voltage on the corresponding one of the data lines DL1-*n* to VCC; and when the read-out voltage is lower than the reference voltage Vref, the sense amplifier 180 sets the voltage on the corresponding one of the data lines DL1-*n* to 0 V. In other words, when the read-out voltage on the corresponding one of the data lines DL1-*n* is higher than the reference voltage Vref the sense amplifier 180 judges that the voltage on the corresponding one of the data lines DL1-*n* is VCC, and that the data stored in the memory cell is "0." On the other hand, when the read-out voltage is lower, the sense amplifier 180 judges that the voltage on the corresponding one of the data lines DL1-*n* is 0V, and that the data is "1."

The data lines DL1-*n* are connected to the output buffer 190, and the output buffer 190 outputs amplified data on the data lines DL1-*n* out of the ferroelectric memory device.

Figure 2:
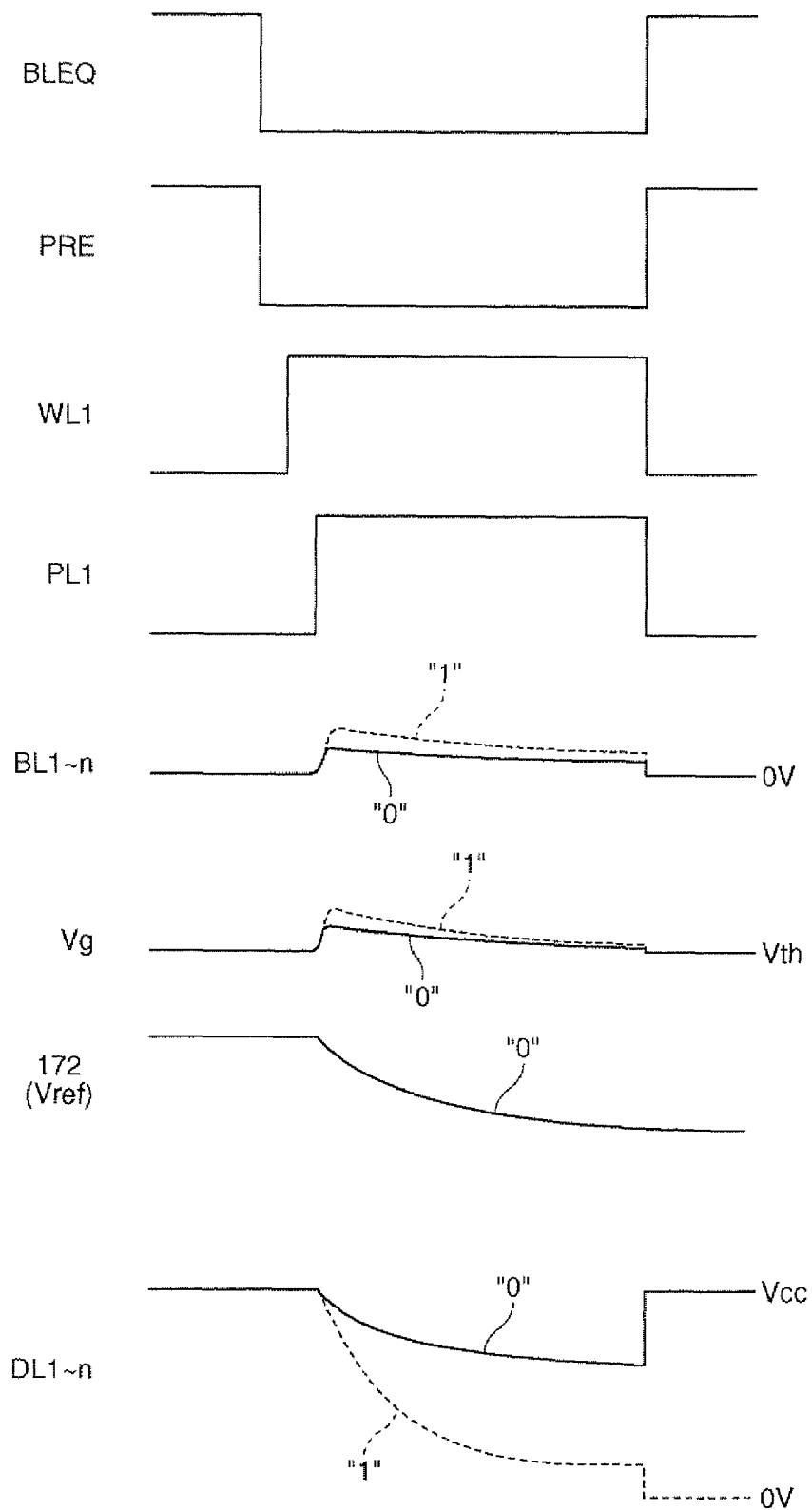
FIG. 2 is a timing chart indicating operations of the ferroelectric memory device in accordance with the present embodiment.

FIG. 2 is a timing chart showing operations of the ferroelectric memory device in accordance with the present embodiment. Referring to FIG. 1 and FIG. 2, operations of the ferroelectric memory device in accordance with the present embodiment are described, using an exemplary case in which the word line WL1 and the plate line PL1 are selected, and data stored in memory cells MC connected to the bit lines BL1-*n* is read out.

In the example described below, when a signal indicates logical L, the voltage of the signal is a ground voltage, and when a signal indicates logical H, the voltage of the signal may be VCC, VDD or VPP, which are operation voltages of the ferroelectric memory device. It is noted that the voltage of each of the signals is not limited to the above, and it only requires that the voltage of a signal indicting logical H is higher than the voltage of a signal indicating logical L.

First, in an initial state, the signal BLEQ indicates logical H, each of the n-type MOS transistors 140 is on, and the voltage on the dummy bit line DBL and bit lines BL1-*n* is at a ground voltage. When the signal BLEQ becomes logical L, the dummy bit line DBL and bit lines BL1-*n* are pre-charged to a ground voltage. Also, the wiring 172 is pre-charged to VCC. Also, in the initial state, the switches 182 and 184 are on, and the sense amplifiers 180 are connected to the drains of the n-type MOS transistors 154 of the read-out voltage generation sections 150 and the wiring 172.

Also, in the initial state, the signal PRE indicates logical H, the signal/PRE indicates logical L, the n-type MOS transistors 156 and the p-type MOS transistors 158 are on, the gate voltage of the n-type MOS transistors 154 is at a threshold voltage Vth, and the drain voltage of the n-type MOS transistors 154 is at VCC. When the signal PRE goes to logical L, the signal/PRE becomes logical H, and the gates and drains of the n-type MOS transistors 154 are pre-charged to Vth and VCC, respectively.

Then, the word line control section 120 elevates the voltage on the word line WL1, thereby turning on the n-type MOS transistors TR composing the memory cells MC connected to the word line WL1. By this, the ferroelectric capacitors C composing the memory cells MC connected to the word line WL1 are connected to the dummy bit line DBL and bit lines BL1-*n*.

Then, the plate line control section 130 elevates the voltage on the plate line PL1 to VCC. By this, VCC is applied to the ferroelectric capacitors C composing the memory cells MC connected to the word line WL1, with the voltage on the dummy bit line DBL and bit lines BL1-*n* as a reference.

By this, according to data stored in the ferroelectric capacitors C, charges retrieved from the ferroelectric capacitors C are discharged to the dummy bit line DBL and bit lines BL1-*n*, such that voltages on the dummy bit line DBL and bit lines BL1-*n* rise. More concretely, the voltage on the bit lines BL1-*n* when the data stored in the memory cells MC is "1" (indicated by a dotted line in the figure) becomes higher than the voltage on the bit lines BL1-*n* when the data is "0" (indicated by a solid line in the figure). Also, in the present embodiment, the area of the ferroelectric capacitor C provided in the memory cell MC connected to the dummy bit line DBL is greater than the area of the ferroelectric capacitor C provided in each of the memory cells MC connected to the bit lines BL1-*n*, and, when the voltage on the dummy bit line DBL when the data stored in the memory cell MC is "1" becomes higher than the voltage on the bit lines BL1-*n*, and the voltage on the dummy bit line DBL when the data is "0" becomes lower than the voltage on the bit lines BL1-*n*.

When the data is read from the memory cells MC, and the voltage on the dummy bit line DBL and bit lines BL1-*n*, in other words, the voltage on one ends of the capacitors 152 rises, the capacitors 152 raise the voltage on the other ends thereof based on the voltage on the one ends, in other words, raise the gate voltage Vg of the n-type MOS transistors 154.

As the gate voltage Vg of the n-type MOS transistors 154 are pre-charged to Vth, when the voltage on the one ends of the capacitors 152 rises, the gate voltage Vg becomes higher than Vth, whereby the n-type MOS transistors 154 turn on.

When the n-type MOS transistors 154 turn on, their drains are connected to the sources grounded through the channel resistance (on resistance) of the n-type MOS transistors 154. Also, the magnitude of the channel resistance of an n-type MOS transistor changes according to the magnitude of the gate voltage Vg. In other words, the channel resistance of the n-type MOS transistor 154 changes according to data stored in the memory cell MC.

Accordingly, the voltages on the data lines DL1-*n* and the dummy data line DLR connected to the drains of the n-type MOS transistors 154 are lowered in a greater amount when the data stored in the memory cells MC is "1," compared to the case when the stored data is "0." In other words, the n-type MOS transistor 154 can greatly amplify a minute change in the gate voltage Vg by changing the drain voltage, in other words, the voltage on the data line DL1-*n* and dummy data line DLR.

Also, when the drain voltage of the n-type MOS transistors 154, in other words, the voltage on one ends of the capacitors 160, is lowered, the capacitors 160 suppress an elevation in the voltage on other ends thereof, in other words, the voltage on the bit lines BL1-*n*. By this, a large potential difference between the bit lines BL1-*n* and the plate line PL1, in other words, a large voltage impressed to the ferroelectric capacitors C can be maintained, such that the amount of charge to be discharged onto the bit lines BL1-*n* can be increased.

Also, when the voltage on the dummy data line DLR changes, the voltage on the positive input terminal of the operation amplifier 170 is changed.

Then, in accordance with the present embodiment, the ferroelectric capacitor C connected to the dummy bit line DBL stores data "0." Furthermore, as described above, the area of the ferroelectric capacitor C connected to the dummy bit line DBL is set larger than the area of each of the other ferroelectric capacitors C. For this reason, the amount of charge to be discharged onto the dummy bit line DBL from the corresponding ferroelectric capacitor C is greater than the amount of charge that is discharged onto the bit lines BL1-*n* from the other ferroelectric capacitors that store data "0." Accordingly, the voltage on the dummy data line DLR connected to the positive input terminal of the operation amplifier 170 becomes to have a voltage value between the voltage on the data lines DL1-*n* when the data stored in the memory cells MC connected to the bit lines BL1-*n* is "0," (hereafter referred to as the "read-out voltage on the data lines DL1-*n* with data '0'") and the voltage on the data lines DL1-*n* when the data is "1" (hereafter referred to as the "read-out voltage on the data lines DL1-*n* with data '1'"), and the negatively fed operation amplifier 170 supplies the voltage on the dummy data line DLR to the wiring 172 that is connected to its output terminal as a reference voltage Vref.

When a predetermined time has elapsed after the read-out voltage and the reference voltage Vre were supplied to the data lines DL1-*n* and the wiring 172, respectively, the logical value of the signal SW is changed, to turn off the switches 182 and 184, whereby the read-out voltage generation sections 150 and the wring 172 are cut off from the sense amplifiers 180. Then, when the operation of the sense amplifiers 180 is started, the sense amplifiers 180 compare the read-out voltage outputted onto the data lines DL1-*n* with the reference voltage supplied to the other ends of the sense amplifiers 180, respectively, thereby judging the data stored in the memory cells MC. More concretely, the sense amplifiers 180, when turned on, raise the voltage on the data lines DL1-*n* to about VCC, respectively, when the read-out voltage is higher than the reference voltage, in other words, when the data stored in the memory cells MC connected to the bit lines BL1-*n* is "0" (indicated by a solid line in the figure); and lower the voltage on the data lines DL1-*n* to about the ground voltage, respectively, when the data is "1" (indicated by a dotted line in the figure). By the operations described above, in the ferroelectric memory device in accordance with the present embodiment, data stored in the ferroelectric capacitors C are read out.

The present embodiment is provided with the operation amplifier 170 having a higher voltage supply capacity, such that the voltage value of a read-out voltage outputted from the read-out voltage generation sections 150 having a lower voltage supply capability can be supplied to a plurality of sense amplifiers 180 with hardly any change, and therefore the ferroelectric memory device with stable read-out operations can be provided. Also, in accordance with the present embodiment, it only requires the operation amplifier 170 having a higher voltage supply capability to be provided for the read-out voltage generation section 150 that is connected to the dummy data line DLR, such that an increase in the chip area of the ferroelectric memory device can be suppressed.

The embodiment examples and application examples described above with reference to the embodiments of the invention may be used, while being appropriately combined, modified or added with improvements depending on different utilities, and the invention described above is not limited to the description of the embodiments described above. It is obvious from the claimed scope of the invention that these modes with combinations, modifications or improvements added thereto can be included in the technical scope of the invention described above.

For example, in the embodiment described above, the area of the ferroelectric capacitor C connected to the dummy bit line DBL is made larger, and data "0" is stored therein. However, the area of the ferroelectric capacitor C connected to the dummy bit line DBL may be made smaller, and data "1" may be stored therein.

Figure 3:
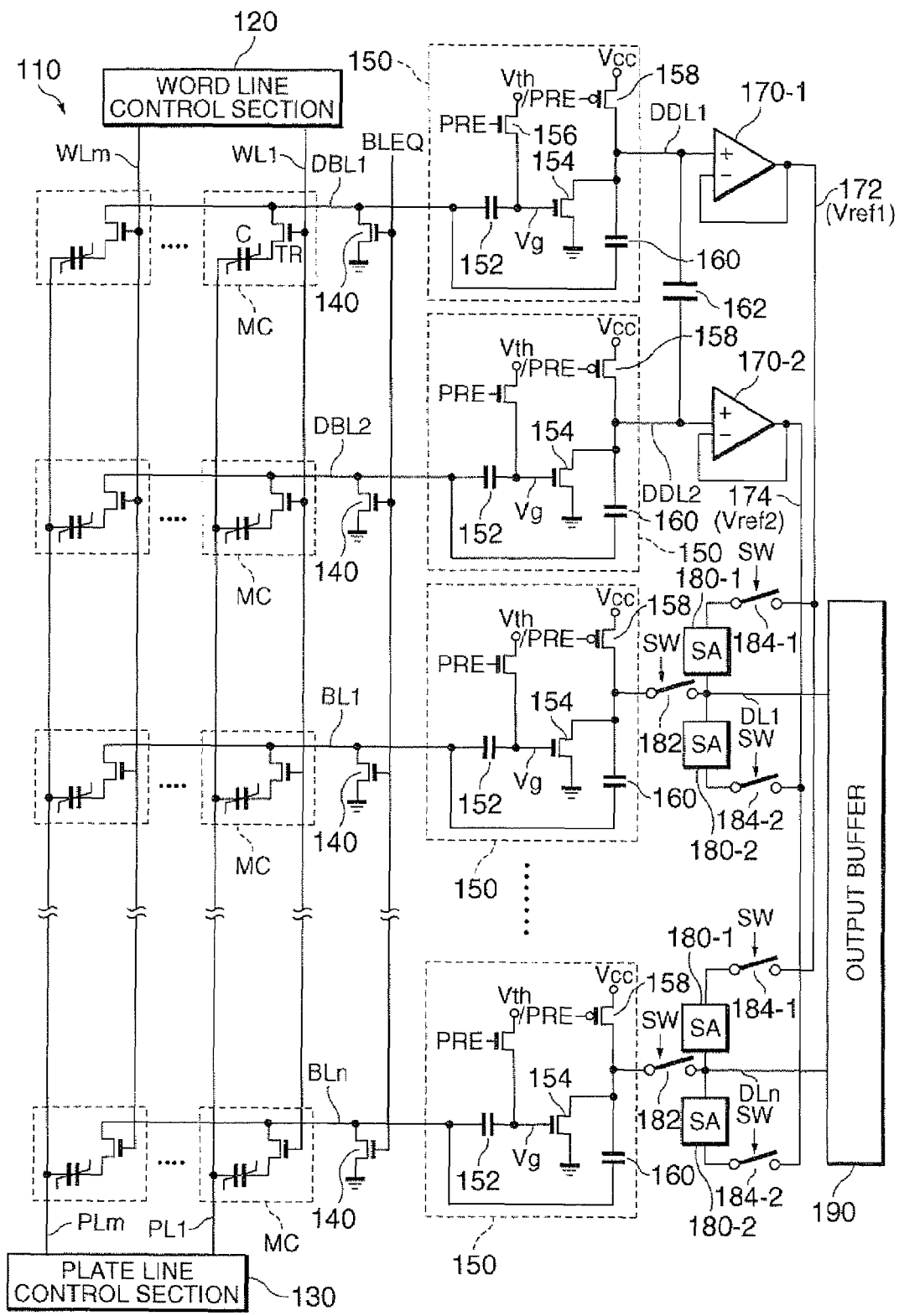
FIG. 3 is a diagram showing a ferroelectric memory device in accordance with a second embodiment of the invention

FIG. 3 is a diagram of a ferroelectric memory device in accordance with a second embodiment of the invention. The ferroelectric memory device in accordance with the second embodiment is described below, centered at aspects different from the first embodiment. It is noted that components appended with the same reference numbers as those of the first embodiment have substantially the same functions as those of the first embodiment.

The ferroelectric memory device in accordance with the second embodiment is different from the ferroelectric memory device in accordance with the first embodiment in that it is quipped with two dummy bit lines DBL1 and 2, two dummy data lines DDL1 and 2, a capacitance element 162, two operation amplifiers 170-1 and 2, and two sense amplifiers 180-1 and 2 for each of the data lines DL1-*n*.

Also, in accordance with the present embodiment, the memory cell MC connected to the dummy bit line DBL1 stores data "0" and the memory cell MC connected to the dummy bit line DBL2 stores data "1." Furthermore, in accordance with the present embodiment, the area of each of the ferroelectric capacitors C connected to the dummy bit lines DBL1 and 2 is generally the same as the area of each of the ferroelectric capacitors C connected to the bit lines BL1-*n*.

The capacitance element 162 has one end connected to the dummy data line DDL1, and the other end connected to the dummy data line DDL2. Also, the capacitance element 162 has a capacitance that is greater than the parasitic capacitance that is present between the dummy data line DDL1 and the dummy data line DDL2.

The operation amplifiers 170-1 and 2 supply voltages that are generally the same as the voltages on the dummy data lines DDL1 and 2 at the time of reading data from the memory cells MC to the wirings 172 and 174 as reference voltages Vref1 and Vref2, respectively. Also, the wiring 172 is connected to the other end of the sense amplifier 180-1, and the wiring 174 is connected to the other end of the sense amplifier 180-2. In other words, the sense amplifier 180-1 compares the reference voltage Vref1 with read-out voltages on the data lines DL1-*n*, respectively, and the sense amplifier 180-2 compares the reference voltage Vref2 with read-out voltages on the data lines DL1-*n*, respectively.

Figure 4:
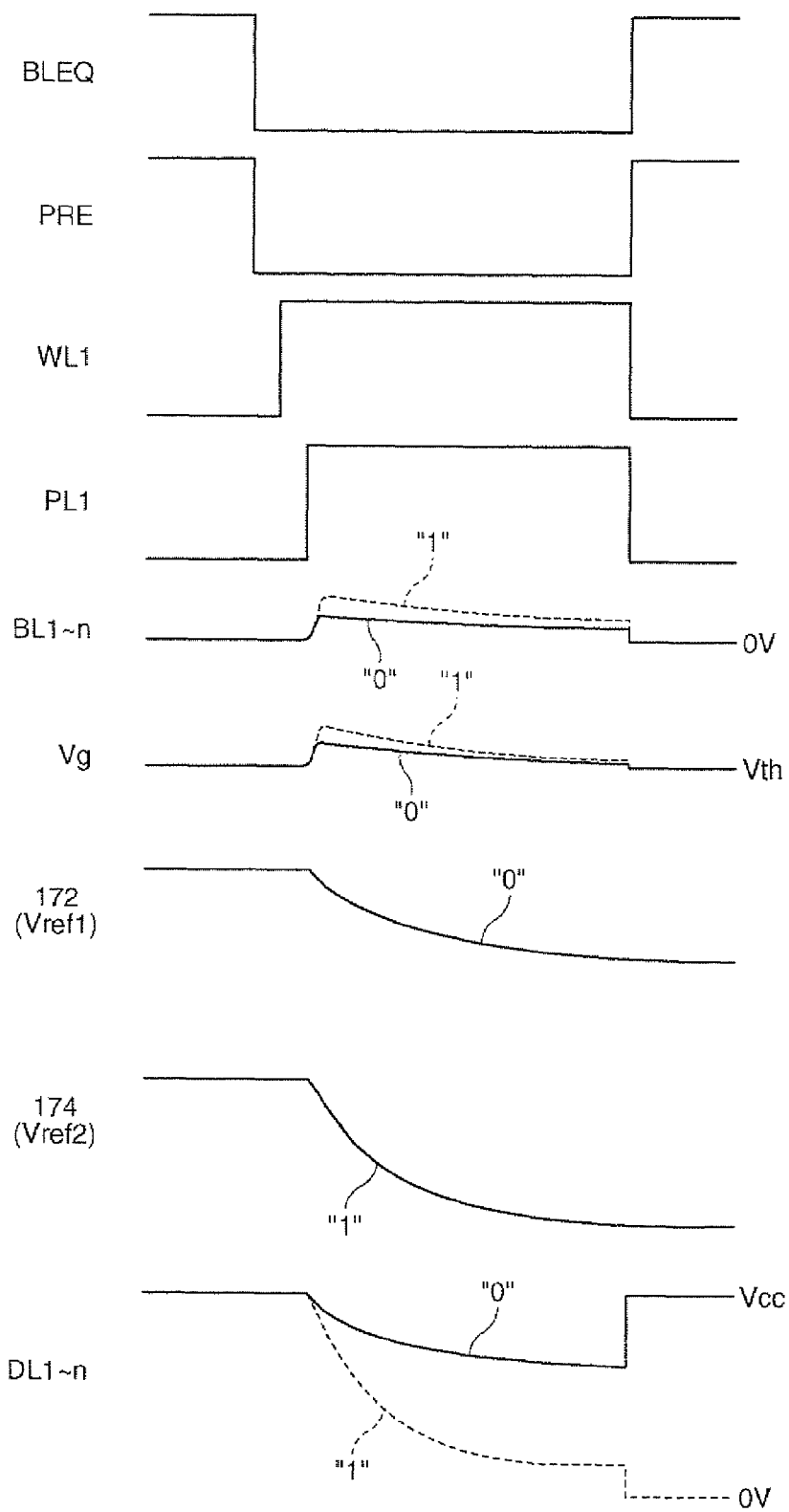
FIG. 4 is a timing chart indicating operations of the ferroelectric memory device in accordance with the present embodiment.
Figure 5:
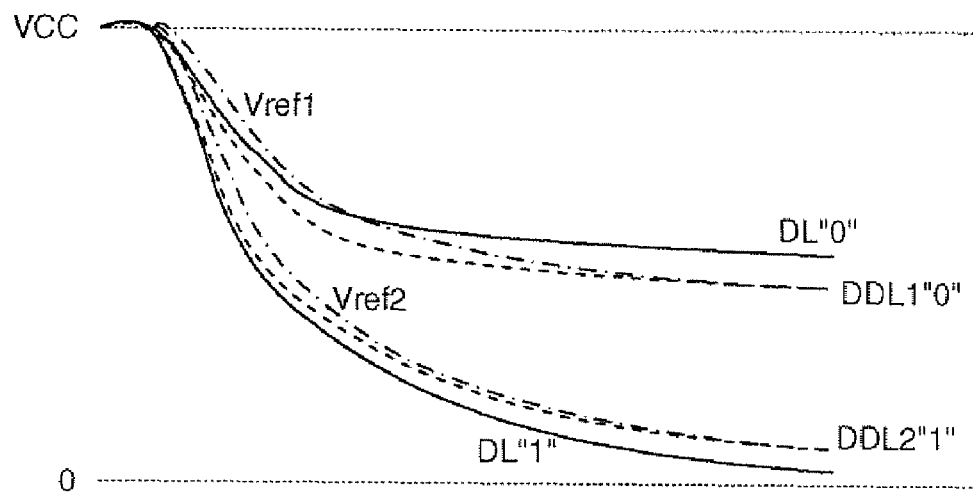
FIG. 5 is a chart that compares changes in voltages on dummy data lines DDL1 and DDL2, reference voltages Vref1 and Vref2, and voltages on data lines DL1-$n$ shown in FIG. 4.

FIG. 4 is a timing chart of operations of the ferroelectric memory device in accordance with the second embodiment. FIG. 5 is a chart that compares changes in voltages on the dummy data line DDL1, the dummy data line DDL2, the data lines DL1-*n* and the reference voltages Vref1 and Vref2, shown in FIG. 4. In FIG. 5, a read-out voltage on the data lines DL1-*n* with data "0" (DL "0"), and a read-out voltage on the data lines DL1-*n* with data "1" (DL "1") are indicated by solid lines; a voltage on the dummy data line DDL1 (DDL1 "1"), and a voltage on the dummy data line DDL2 (DDL2 "0") are indicated by dotted lines; and voltages of the reference voltages Vref1 and 2 are indicated by dot-and-dash lines. Referring to FIG. 3 through FIG. 5, operations of the ferroelectric memory device in accordance with the second embodiment are described, centered at features different from the first embodiment, using an exemplary case where the word line WL1 and the plate line PL1 are selected, and data stored in the memory cells MC connected to the bit lines BL1-*n* are read out.

As the voltage on the word line WL1 and the plate line PL1 rises and data is read from the memory cells MC, the voltage on the dummy bit lines DBL1 and 2 and bit lines BL1-*n* rises, and the voltage on the dummy data lines DDL1 and 2 and data lines DL1-*n* lowers according to the data stored in the respective memory cells MC.

In the present example, the memory cell MC connected to the dummy bit line DBL1 stores data "0," and the memory cell MC connected to the dummy bit line DBL2 stores data "1" such that, when the data is read from each of the memory cells MC, the drain voltage of the n-type MOS transistor 154 connected to dummy data line DDL1 (DDL1 "0") lowers, like the read-out voltage on the data lines DL1-*n* with data "0" (DL "0"); and the drain voltage of the n-type MOS transistor 154 connected to the dummy data line DDL2 (DDL2 "1")

lowers, like the read-out voltage on the data lines DL1-*n* with data "1" (DL "1"), as shown in FIG. 5. However, as the capacitance element 162 is provided between the dummy data line DDL1 and the dummy data line DDL2, the voltage on the dummy data line DDL1 becomes lower than the read-out voltage on the data lines DL1-*n* with data "0," and the voltage on the dummy data line DDL2 becomes higher than the read-out voltage on the data lines DL1-*n* with data "1." Then, the operation amplifiers 170-1 and 2 supply the voltages on the dummy data lines DDL1 and 2 (DDL1 "0" and DDL2 "1"), as the reference voltages Vref 1 and 2, to the wirings 171 and 174, respectively.

The sense amplifier 180-1 compares the read-out voltage outputted onto the data lines DL1-*n* with the reference voltage Vref1 corresponding to data "0," and the sense amplifier 180-2 compares the read-out voltage with the reference voltage Vref2 corresponding to data "1." Because the read-out voltage on the data lines DL1-*n* with data "0" is higher than the reference voltages Vref1 and 2, the sense amplifiers 180-1 and 2 raise the voltage on the data lines DL1-*n* to about VCC (as indicated by a solid line in FIG. 4).

On the other hand, because the read-out voltage on the data lines DL1-*n* with data "1" is lower than the reference voltages Vref1 and 2, the sense amplifiers 180-1 and 2 lower the voltage on the data lines DL1-*n* to about 0V (as indicated by a dotted line in FIG. 4). By the operations described above, in the ferroelectric memory device in accordance with the present embodiment, data stored in the ferroelectric capacitors C is read out.

It is noted that the capacitance element 162 is connected between the dummy data lines DDL1 and DDL2 in accordance with the present embodiment. However, the device can normally operate without the capacitance element 162.

In this case, when data "0" is read out onto the bit lines BL1-*n*, the reference voltage Vref1 is equal to the read-out voltage on the data lines DL1-*n* with data "0" such that the operation of the sense amplifier 180-1 momentarily becomes unstable. However, as the reference voltage Vref2 is lower than the read-out voltage on the data lines DL1-*n* with data "0," the sense amplifier 180-2 raises the voltage on the data lines DL1-*n* when the sense amplifier 180-2 operates. As the voltage on the data lines DL1-*n* rises, the read-out voltage on the data lines DL1-*n* becomes higher than the reference voltage Vref1, and the operation of the sense amplifier 180-1 becomes stabilized, and the two sense amplifiers together elevates the voltage on the data lines DL1-*n* to about VCC.

Also, when data "0" is read out onto the bit lines BL1-*n*, in reverse to the above, while the sense amplifier 180-2 momentarily becomes unstable, the sense amplifier 180-1 lowers the voltage on the data lines DL1-*n*, such that the two sense amplifiers 180-1 and 2 together lower the voltage on the data lines DL1-*n* to about 0V.

On the other hand, in accordance with the present embodiment, because the capacitance element 162 is connected between the dummy data lines DDL1 and DDL2, the operation state of one of the sense amplifiers does not become unstable, and both of the sense amplifiers always work together to amplify the voltage on the data lines DL1-*n*. Accordingly, the read-out margin of the sense amplifiers 180-1 and 180-2 can be improved, and the sensing operation can be made faster.

The embodiment examples and application examples described above with reference to the embodiments of the invention may be used, while being appropriately combined, modified or added with improvements depending on different utilities, and the invention described above is not limited to the description of the embodiments described above. It is obvious from the claimed scope of the invention that these modes with combinations, modifications or improvements added thereto can be included in the technical scope of the invention described above.

For example, in the embodiment described above, the ferroelectric capacitor connected to the dummy bit line DBL1 stores data "0," and the ferroelectric capacitor connected to the dummy bit line DBL2 stores data "1." However, they can be reversed. Also, data stored in the ferroelectric capacitor connected to the dummy bit line DBL1 and data stored in the ferroelectric capacitor connected to the dummy bit line DBL2 may be interchanged at each access or at irregular intervals.

It is noted that the capacitance element 162 may be a ferroelectric capacitor. When the capacitance element 162 is formed from a ferroelectric capacitor, the capacitance element 162 can be disposed in an extremely small area, such that a ferroelectric memory device with a much smaller chip area can be realized.

In general, in the case of disposing identical semiconductor circuits, not only their pattern structure, but the pattern structure of surrounding circuits may also be formed substantially identical with one another, whereby minute differences in pattern configuration among the identical circuits can be eliminated and errors in electrical characteristics can be suppressed. Accordingly, a dummy sense amplifier that is equivalent to the sense amplifiers 180-1 and 2 may be disposed between the dummy data lines DDL1 and DDL2, and the parasitic capacitance within the dummy sense amplifier may be used as the capacitance element 162. In this case, errors in electrical characteristics among the circuits adjacent to the newly disposed dummy sense amplifier, in other words, errors in electrical characteristics between the read-out voltage generation sections 150 connected to the dummy bit lines DBL1 and 2 and the sense amplifiers 180-1 and 2 connected to the data line DL1 can be reduced.

Alternatively, another means may be used to generate the reference voltages Vref1 and Vref2 without providing the capacitance element 162 between the dummy data lines DDL1 and DDL2. For example, without providing the capacitance element 162, the capacitance of the memory cell MC connected to the dummy bit line DBL1 may be differentiated from the capacitance of the memory cell MC connected to the dummy bit line DBL2, to thereby generate the reference voltages Vref1 and Vref2.

Figure 6:
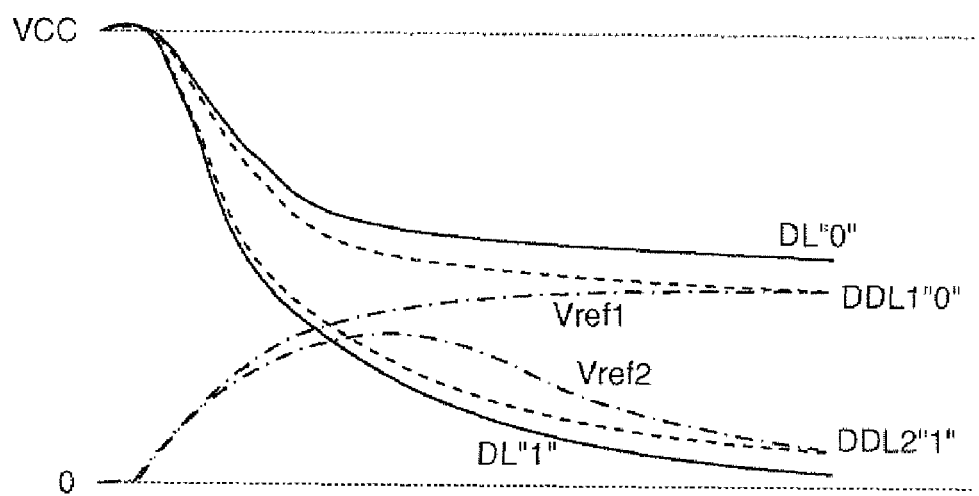
FIG. 6 is a chart that compares changes in voltages on dummy data lines DDL1 and DDL2, read-out voltages on data lines DL1-$n$, and reference voltages Vref1 and Vref2, in accordance with another example of the second embodiment.

FIG. 6 is a chart showing changes in read-out voltages on the data lines DL1-*n* and reference voltages Vref1 and Vref2 in accordance with another example of the second embodiment. The wirings 172 and 174 are pre-charged to VCC in the example described above with reference to FIG. 4, but they are pre-charged to 0V in the present example. In FIG. 6, a read-out voltage on the data lines DL1-*n* with data "0" (DL "0"), and a read-out voltage on the data lines DL1-*n* with data "1" (DL "1") are indicated by solid lines; a voltage on the dummy data line DDL1 (DDL1 "0"), and a voltage on the dummy data line DDL2 (DDL2 "1") are indicated by dotted lines; and voltages of the reference voltages Vref1 and 2 are indicated by dot-and-dash lines.

As shown in FIG. 6, when the wirings 172 and 174 are pre-charged to 0V, it takes a little while for the voltage of the reference voltages Vref1 and Vref2 to follow the voltage on the dummy data line DDL1 (DDL1 "0") and the voltage on the dummy data line DDL2 (DDL2 "1"). For this reason, the potential difference between the reference voltage Vref1 and the read-out voltage on the data lines DL1-*n* with data "0", and the potential difference between the reference voltage Vref2 and the read-out voltage on the data lines DL1-n with data "1" are broadened, whereby the read-out margin can be further improved.

The embodiment examples and application examples described above with reference to the embodiments of the invention may be used, while being appropriately combined, modified or added with improvements depending on different utilities, and the invention described above is not limited to the description of the embodiments described above. It is obvious from the claimed scope of the invention that these modes with combinations, modifications or improvements added thereto can be included in the technical scope of the invention described above.

What is claimed is:

1. A ferroelectric memory device comprising:
   a plurality of first bit lines;
   a plurality of first memory cells that are connected to each of the first bit lines and store first data or second data;
   a plurality of first read-out voltage generation sections, each of which is connected to each of the plurality of first bit lines, and upon reading data from the plurality of first memory cells, generates a read-out voltage based on the data;
   a second bit line;
   a second memory cell that is connected to the second bit line and stores the first data;
   a second read-out voltage generation section that is connected to the second bit line, and upon reading data from the second memory cell, generates a read-out voltage based on the data;
   a first reference voltage generation section connected to the second read-out voltage generation section; and
   a plurality of first sense amplifiers connected to each of the read-out voltage generation sections and the first reference voltage generation section,
   wherein each of the read-out voltage generation sections includes a first n-type MOS transistor having a source to which a first voltage is supplied, a first precharge section that pre-charges a drain of the first n-type MOS transistor with a second voltage that is a positive voltage higher than the first voltage, a transistor control section that, when data stored in any of the memory cells is read out onto each of the bit lines, controls a channel resistance between the source and the drain of the first n-type MOS transistor based on a voltage on the bit line to lower the voltage on the drain pre-charged to the second voltage, thereby generating the read-out voltage, and a voltage control section that lowers the voltage on the bit line based on the lowering of the voltage on the drain;
   the first reference voltage generation section has a voltage supply capacity greater than the second read-out voltage generation section, and receives a read-out voltage generated by the second read-out voltage generation section, and generates a first reference voltage that is generally the same voltage as the read-out voltage; and
   the plurality of first sense amplifiers compare the read-out voltage generated by the corresponding first read-out voltage generation sections with the first reference voltage, respectively, to thereby judge data stored in the first memory cells.

2. A ferroelectric memory device according to claim 1, wherein the first reference voltage generation section is an operation amplifier being negatively fed back, receives a read-out voltage generated by the second read-out voltage generation section as an input, and outputs the first reference voltage.

3. A ferroelectric memory device according to claim 1, further comprising:
   a third bit line;
   a third memory cell that is connected to the third bit line and stores second data;
   a third read-out voltage generation section that is connected to the third bit line, and generates a read-out voltage based on data read out from the third memory cell;
   a second reference voltage generation section that has a voltage supply capacity greater than the third read-out voltage generation section, and generates a second reference voltage that is generally the same voltage as the read-out voltage generated by the third read-out voltage generation section; and
   a plurality of second sense amplifiers that are connected to each of the first read-out voltage generation sections, and compare the read-out voltage generated by each of the first read-out voltage generation sections with the second reference voltage,
   wherein the first sense amplifier and the second sense amplifier connected to each of the corresponding first bit lines judge the data read out from each of the corresponding first memory cells based on a comparison result of the first sense amplifier and a comparison result of the second sense amplifier.

4. A ferroelectric memory device according to claim 3, further comprising:
   a first wiring that is connected to the second read-out voltage generation section and the first reference voltage generation section, and supplies a read-out voltage generated by the second read-out voltage generation section to the first reference voltage generation section;
   a second wiring that is connected to the third read-out voltage generation section and the second reference voltage generation section, and supplies a read-out voltage generated by the third read-out voltage generation section to the second reference voltage generation section; and
   a capacitance element provided between the first wiring and the second wiring.

5. A ferroelectric memory device according to claim 3, wherein the first reference voltage generation section is a first operation amplifier being negatively fed back, receives a read-out voltage generated by the second read-out voltage generation section as an input, and outputs the first reference voltage, and the second reference voltage generation section is a second operation amplifier being negatively fed back, receives a read-out voltage generated by the third read-out voltage generation section, and outputs the second reference voltage.

6. A ferroelectric memory device according to claim 5, further comprising:
   a first reference voltage line that is connected to an output of the first operation amplifier and the plurality of first sense amplifiers;
   a second reference voltage line that is connected to an output of the second operation amplifier and the plurality of second sense amplifiers; and
   a second precharge section that pre-charges the first reference voltage line and the second reference voltage line to a first voltage,
   wherein the first reference voltage generation section and the second reference voltage generation section supply the first reference voltage and the second reference voltage to the first reference voltage line and the second reference voltage line pre-charged to the first voltage.

7. A ferroelectric memory device according to claim 1, wherein the transistor control section includes a third pre-charge section that pre-charges the gate of the first n-type MOS transistor to a specified positive voltage, and a first capacitor provided between the bit line and the gate.

8. A ferroelectric memory device according to claim 7, wherein the second precharge section pre-charges the gate to a threshold voltage of the first n-type MOS transistor.

9. A ferroelectric memory device according to claim 1, wherein the voltage control section includes a second capacitor provided between the drain of the first n-type MOS transistor and the bit line.

10. A ferroelectric memory device according to claim 1, wherein the first voltage is a ground voltage.

* * * * *